(12) United States Patent
Liu et al.

(10) Patent No.: US 7,399,429 B2
(45) Date of Patent: *Jul. 15, 2008

(54) III-V SEMICONDUCTOR NANOCRYSTAL COMPLEXES AND METHODS OF MAKING SAME

(75) Inventors: Wei Liu, Guilderland, NY (US); Adam Peng, Guilderland, NY (US); Daniel Landry, Clifton Park, NY (US)

(73) Assignee: Evident Technologies, Inc., Troy, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/125,129

(22) Filed: May 10, 2005

(65) Prior Publication Data

US 2006/0001119 A1 Jan. 5, 2006

Related U.S. Application Data

(60) Provisional application No. 60/569,452, filed on May 10, 2004.

(51) Int. Cl.
*C09K 11/62* (2006.01)
*C09K 11/63* (2006.01)
*C09K 11/64* (2006.01)
*C09K 11/70* (2006.01)
*C09K 11/74* (2006.01)
*C09K 11/75* (2006.01)

(52) U.S. Cl. .............. 252/301.4 R; 428/403; 428/402; 977/815; 977/816; 977/817; 977/818; 977/819; 977/820; 977/821; 977/822; 977/823; 977/834

(58) Field of Classification Search .......... 252/301.4 R; 428/403, 402; 423/299, 406, 351
See application file for complete search history.

(56) References Cited

U.S. PATENT DOCUMENTS

| | | | |
|---|---|---|---|
| 2002/0160195 A1* | 10/2002 | Halas et al. ................. | 428/403 |
| 2002/0187347 A1* | 12/2002 | Halas et al. ................. | 428/403 |
| 2005/0129947 A1 | 6/2005 | Peng et al. | |

OTHER PUBLICATIONS

Talapin et al, "Etching of Colloidal InP Nanaocrsytals with Fluorides: Photochemical Nature of the Process Resulting in High Photoluminescent Efficiency", J. Phys. Chem. B, vol. 106, No. 49, pp. 12659-12663, Nov. 2002.*
Borchert et al, "Investigation of ZnS Passivated InP Nanocrsytals by XPS", Nanoletters, vol. 2, No. 2, pp. 151-154, 2002.*
Micic et al, "Highly Efficient Band-edge Emission From InP Quantum Dots", Appl. Phys. Lett. vol. 68, No. 22, pp. 3150-3152, May 1996.*

(Continued)

*Primary Examiner*—C. Melissa Koslow
(74) *Attorney, Agent, or Firm*—Kenyon & Kenyon LLP

(57) ABSTRACT

A semiconductor nanocrystal complex that is stable and has high luminescent quantum yield. The semiconductor nanocrystal complex has a semiconductor nanocrystal core of a III-V semiconductor nanocrystal material. A method of making a semiconductor nanocrystal complex is also provided. The method includes synthesizing a semiconductor nanocrystal core of a III-V semiconductor nanocrystal material, and forming a metal layer on the semiconductor nanocrystal core after synthesis of the semiconductor nanocrystal core.

19 Claims, 3 Drawing Sheets

OTHER PUBLICATIONS

Abstarct for "Synthesis and Characterization of binary and ternary III-V Quantum Dots", Micic et al, Journ. Luminesc., vol. 70, issues 1-6, pp. 95-107, Oct. 1996.*

Blackburn et al., article entitled, "Electron and Hole Transfer from Indium Phosphide Quantum Dots", J. Phys. Chem. B., 2005, vol. 109, pp. 2625-2631.

Talapin et al., article entitled, "Etching of Colloidal InP Nanocrystals with Fluorides: Photochemical Nature of the Process Resulting in High Photoluminescence Efficiency", J. Phys. Chem. B., 2002, pp. 12659-12663, vol. 106.

Battaglia et al., article entitled, "Formation of High Quality InP and InAs Nanocrystals in a Noncoordinating Solvent", Nano Letters, 2002, pp. 1027-1030, vol. 2, No. 9.

Borchert et al., article entitled, "Investigation of ZnS Passivated InP Nanocrystals by XPS", Nano Letters, 2002, pp. 151-154, vol. 2, No. 2.

Nagesha et al., article entitled, "$In_2S_3$ Nanocolloids with Excitonic Emission: $In_2S_3$ vs CdS Comparative Study of Optical and Structural Characteristics", J. Phys. Chem. B, 2001, pp. 7490-7498, vol. 105.

Micic et al., article entitled, "Core-Shell Quantum Dots of Lattice-Matched $ZnCdSe_2$ Shells on InP Cores: Experiment and Theory", J. Phys. Chem. B, 2000, pp. 12149-12156, vol. 104.

Cao et al., article entitled, "Growth and Properties of Semiconductor Core/Shell Nanocrystals with InAs Cores", J. Am. Chem. Soc., 2000, pp. 9692-9702, vol. 122.

A. Segura et al., article entitled, "Strong optical nonlinearities in gallium and indium selenides related to inter-valence-band transitions induced by light pulses", Physical Review B., pp. 4075-4084, vol. 56, #7, Aug. 15, 1997.

A. Guzelian et al., article entitled, "Synthesis of Size-Selected, Surface-Passivated InP Nanocrystals", J. Phys. Chem., 1996, pp. 7212-7219, vol. 100.

Micic et al., article entitled, "Synthesis and Characterization of InP, GaP, and $GaInP_2$ Quantum Dots", J. Phys. Chem. 1995, pp. 7754-7759.

Micic et al., article entitled, "Synthesis and Characterization of InP Quantum Dots", J. Phy. Chem., 1994, pp. 4966-4969, vol. 98.

Brus, L., Quantum Crystallites and Nonlinear Optics, Applied Physics A, 53 (1991).

Rossetti, R.; Brus, L., Electron-Hole Recombination Emission as a Probe of Surface Chemistry in Aqueous CdS Colloids, J. Phys. Chem., 86, 172 (1982).

Fotjik, A., Henglein, A., Photochemistry of Colloidal Metal Sulfides, Photo-Physics of Extremely Small CdS Particles: Q-State CdS and Magic Agglomeration Numbers, Ber. Bunsenges. Phys. Chem., 88, (1984).

Fischer, C., Fotjik, A., Henglein, A., Photochemistry of Colloidal Semiconductors, Exclusion Chromatography and Stop Flow Experiments on the Formation of Extremely Small CdS Particles, Ber. Bunsenges. Phys. Chem., (1986).

Spanhel, L., Henglein, A., Photochemistry of Colloidal Semiconductors, Surface Modification and Stability of Strong Luminescing CdS Particles, Am. Chem. Soc., 109 (1987).

Kortan, R., Brus, L., Nucleation and Growth of CdSe on ZnS Quantum Crystallite Seeds, and Vice Versa, in Inverse Micelle Media, J. Am. Chem. Soc., 112 (1990).

Murray, C., Norris, D., Bawendi, M., Synthesis and Characterization of Nearly Monodisperse CdE (E=S, Se, Te) Semiconductor Nanocrystallites, J. Am. Chem. Soc., 115, (1993).

Katari, J., Alivisatos, A., X-ray Photoelectron Spectroscopy of CdSe Nanocrystals with Applications to Studies of the Nanocrystal Surface, J. Phys. Chem., 98 (1994).

Hines, et al., Synthesis and Characterization of Strongly Luminescing ZnS Capped CdSe Nanocrystals, J. Phys. Chem., 100:468-471 (1996).

Haubold, S., et al., Strongly Luminescent InP/ZnS Core-Shell Nanoparticles, ChemPhysChem 2001, 5, 331-334 (2001).

Micic, O., Nozik, A., Synthesis and Characterization of Binary and Ternary III-V Quantum Dots, J. Luninescence, 70, 95-107 (1996).

Notice of Transmittal of the ISR and the WO of the ISA for PCT/US05/16481, mailed on Sep. 19, 2006.

* cited by examiner

III-V SEMICONDUCTOR NANOCRYSTAL COMPLEXES AND METHODS OF MAKING SAME

CROSS-REFERENCE TO RELATED APPLICATIONS

The present application claims priority to U.S. Provisional Application No. 60/569,452, filed May 10, 2004, which is incorporated by reference herein.

FIELD OF THE INVENTION

The present invention relates to semiconductor nanocrystal complexes and particularly to III-V semiconductor nanocrystal complexes. The present invention also relates to methods of making semiconductor nanocrystal complexes.

BACKGROUND OF THE INVENTION

Semiconductor nanocrystals are typically tiny crystals of II-VI, III-V, IV-VI materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra. In 1991, Brus wrote a paper reviewing the theoretical and experimental research conducted on colloidally grown semiconductor nanocrystals, such as cadmium selenide (CdSe) in particular. Brus L., *Quantum Crystallites and Nonlinear Optics, Applied Physics A,* 53 (1991)). That research, precipitated in the early 1980's by the likes of Efros, Ekimov, and Brus himself, greatly accelerated by the end of the 1980's as demonstrated by the increase in the number of papers concerning colloidally grown semiconductor nanocrystals.

Quantum yield (i.e. the percent of absorbed photons that are reemitted as photons) is influenced largely by the surface quality of the nanocrystal. Photoexcited charge carriers will emit light upon direct recombination but will give up the excitation energy as heat if photon or defect mediated recombination paths are prevalent. Because the nanocrystal may have a large surface area to volume ratio, dislocations present on the surface or adsorbed surface molecules having a significant potential difference from the nanocrystal itself will tend to trap excited state carriers and prevent radiative recombination and thus reduce quantum yield. It has been shown that quantum yield can be increased by removing surface defects and separating adsorbed surface molecules from the nanocrystal by adding a shell of a semiconductor with a wider bulk bandgap than that of the core semiconductor.

Inorganic colloids have been studied for over a century ever since Michael Faraday's production of gold sols in 1857. Rossetti and Brus began work on semiconductor colloids in 1982 by preparing and studying the luminescent properties of colloids consisting of II-VI semiconductors, namely cadmium sulfide (CdS). (Rossetti, R.; Brus L., *Electron-Hole Recombination Emission as a Probe of Surface Chemistry in Aqueous CdS Colloids, J. Phys. Chem.,* 86, 172 (1982)). In that paper, they describe the preparation and resultant optical properties of CdS colloids, where the mean diameter of the suspended particles is greater than 20 nm. Because the sizes of the particles were greater than the exaction Bohr radius, quantum confinement effects that result in the blue shifting of the fluorescence peak was not observed. However, fluorescence at the bulk bandedge energies were observed and had a FWHM of 50-60 nm.

CdS colloids exhibiting quantum confinement effects (blue shifted maxima in the absorption spectra) were being prepared since 1984. (Fotjik A., Henglein A., *Ber. Bunsenges. Phys. Chem.,* 88, (1984); Fischer C., Fotjik A., Henglein A., *Ber. Bunsenges. Phys. Chem.,* (1986)). In 1987, Spanhel and Henglein prepared CdS colloids having mean particle diameters between 4 and 6 nm. (Spanhel L., Henglein A., *Photochemistry of Colloidal Semiconductors, Surface Modification and Stability of Strong Luminescing CdS Particles, Am. Chem. Soc.,* 109 (1987)). The colloids demonstrated quantum confinement effects including the observation of size dependent absorption maxima (first exciton peaks) as well as size dependent fluorescent spectra. The colloids were prepared by bubbling a sulphur containing gas ($H_2S$) through an alkaline solution containing dissolved cadmium ions. The size and resultant color (of the fluorescence) of the resultant nanocrystals were dependent upon the pH of the solution. The colloids were further modified or "activated" by the addition of cadmium hydroxide to the solution that coated the suspended nanocrystals. The resultant core-shell nanocrystals demonstrated that the quantum yield of the photoluminescence was increased from under 1% to well over 50% with a FWHM of the photoluminescent spectra under 50 nm for some of the preparations.

Kortan and Brus developed a method for creating CdSe coated zinc sulphide (ZnS) nanocrystals and the opposite, zinc sulphide coated cadmium selenide nanocrystals. (Kortan R., Brus L., *Nucleation and Growth of CdSe on ZnS Quantum Crystallite Seeds, and Vice Versa, in Inverse Micelle Media, J. Am. Chem. Soc.,* 112 (1990)). The preparation grew ZnS on CdSe "seeds" using a organometallic precursor-based reverse micelle technique and kept them in solution via an organic capping layer (thiol phenol). The CdSe core nanocrystals had diameters between 3.5 and 4 nm and demonstrated quantum confinement effects including observable exciton absorption peaks and blue shifted photoluminescence. Using another preparation, CdSe cores were coated by a 0.4 nm layer of ZnS. The photoluminescence spectra of the resultant core-shell nanocrystals indicates a peak fluorescence at 530 nm with an approximate 40-45 nm FWHM.

Murray and Bawendi developed an organometallic preparation capable of making CdSe, CdS, and CdTe nanocrystals. (Murray C., Norris D., Bawendi M., *Synthesis and Characterization of Nearly Monodisperse CdE (E=S, Se, Te) Semiconductor Nanocrystallites, J. Am. Chem. Soc.*, 115, (1993)). This work, based on the earlier works of Brus, Henglein, Peyghambarian, allowed for the growth of nanocrystals having a diameter between 1.2 nm and 11.5 nm and with a narrow size distribution (<5%). The synthesis involved a homogeneous nucleation step followed by a growth step. The nucleation step is initiated by the injection of an organometallic cadmium precursor (dimethyl cadmium) with a selenium precursor (TOPSe-TriOctylPhosphine Selenium) into a heated bath containing coordinating ligands (TOPO-TriOctylPhosphineOxide). The precursors disassociate in the solvent, causing the cadmium and selenium to combine to form a growing nanocrystal. The TOPO coordinates with the nanocrystal to moderate and control the growth. The resultant nanocrystal solution showed an approximate 10% size distribution, however, by titrating the solution with methanol the larger nanocrystals could be selectively precipitated from the solution thereby reducing the overall size distribution. After size selective precipitation, the resultant nanocrystals in solution were monodisperse (capable of reaching a 5% size distribution) but were slightly prolate (i.e. nonspherical having an aspect ratio between 1.1 and 1.3). The photoluminescence spectra show a FWHM of approximately 30-35 nm and a quantum yield of approximately 9.6%.

Katari and Alivisatos slightly modified the Murray preparation to make CdSe nanocrystals. (Katari J., Alivisatos A., *X-ray Photoelectron Spectroscopy of CdSe Nanocrystals with Applications to Studies of the Nanocrystal Surface, J. Phys. Chem.*, 98 (1994)). They found that by substituting the selenium precursor TOPSe with TBPSe (TriButylPhosphineSelenide), nanocrystals were produced that were monodisperse without size selective precipitation, were crystalline, and spherical. The nanocrystals were size tunable from 1.8 nm to 6.7 nm in diameter and had an exciton peak position ranging from 1.9-2.5 eV (corresponding to 635-496 nm wavelength). Like the Murray paper, TOPO was used as the coordinating ligand.

Hines and Guyot-Sionest developed a method for synthesizing a ZnS shell around a CdSe core nanocrystal. (Hines et al., "Synthesis and Characterization of strongly Luminescing ZnS capped CdSe Nanocrystals"; J. Phys. Chem., 100:468-471 (1996)). The CdSe cores, having a monodisperse distribution between 2.7 nm and 3.0 nm (i.e. 5% size distribution with average nanocrystal diameter being 2.85 nm), were produced using the Katari and Alivisatos variation of the Murray synthesis. The photoluminescence spectra of the core shows a FWHM of approximately 30 nm with a peak at approximately 540 nm. The core CdSe nanocrystals were separated, purified, and resuspended in a TOPO solvent. The solution was heated and injected with zinc and sulphur precursors (dimethyl zinc and $(TMS)_2S$) to form a ZnS shell around the CdSe cores. The resultant shells were 0.6±0.3 nm thick, corresponding to 1-3 monolayers. The photoluminescence of the core-shell nanocrystals had a peak at 545 nm, FWHM of 40 nm, and a quantum yield of 50%.

One exemplary problem associated with known colloidal shell synthesis methods is that they are limited in regard to the growth of high quality III-V semiconductor nanocrystals due, at least in part, to the covalent nature of the material. Past attempts at growing III-V semiconductor nanocrystals have resulted in quantum yields of approximately 10%. Micic et al., J. Phys. Chem. B. 2000, 104, 12149 -12156. It has been shown using a slow growth technique that indium phosphate (InP) core nanocrystals with a shell of zinc sulphide (ZnS) may result in quantum yields of 20% but this process takes days to complete. Haubold et al., ChemPhysChem 2001, 5, 331. Many applications of nanocrystal complexes, such as LEDs, inks, and pigments, require higher luminescent quantum yields.

Additionally, the growth of III-V nanocrystals is difficult because of the need for vacuum growth and strict humidity conditions. Etching has shown to improve the quantum yield of III-V materials however, the etching process introduces problems when bonding ligands to the surface of the nanocrystals. This causes poor colloidal stability and makes the complexes incompatible for a variety of applications. In addition, the etched surface does not provide sufficient electronic passivation. As a result, electronic interaction between a matrix material and the nanocrystal may result in fluorescence quenching.

Additionally, etching relies on photoexcitation, which requires dilute mixtures. This is not conducive to the scale up and production of large quantities of III-V semiconductor nanocrystal complexes. By readily losing their fluorescence, these quantum dot materials are simply unsuitable for most applications.

Thus, it is necessary to develop a stable III-V semiconductor nanocrystal complex that is brightly fluorescing, and soluble in most common solvents.

SUMMARY OF THE INVENTION

In an embodiment, the present invention provides a semiconductor nanocrystal complex comprising a III-V semiconductor nanocrystal core, wherein the semiconductor nanocrystal complex is stable and exhibits a high luminescent quantum yield.

Additionally, the present invention provides for a method of making a semiconductor nanocrystal complex comprising a III-V semiconductor nanocrystal core, wherein the semiconductor nanocrystal complex is stable and exhibits a high luminescent quantum yield.

DETAILED DESCRIPTION OF THE INVENTION

Figure 1:
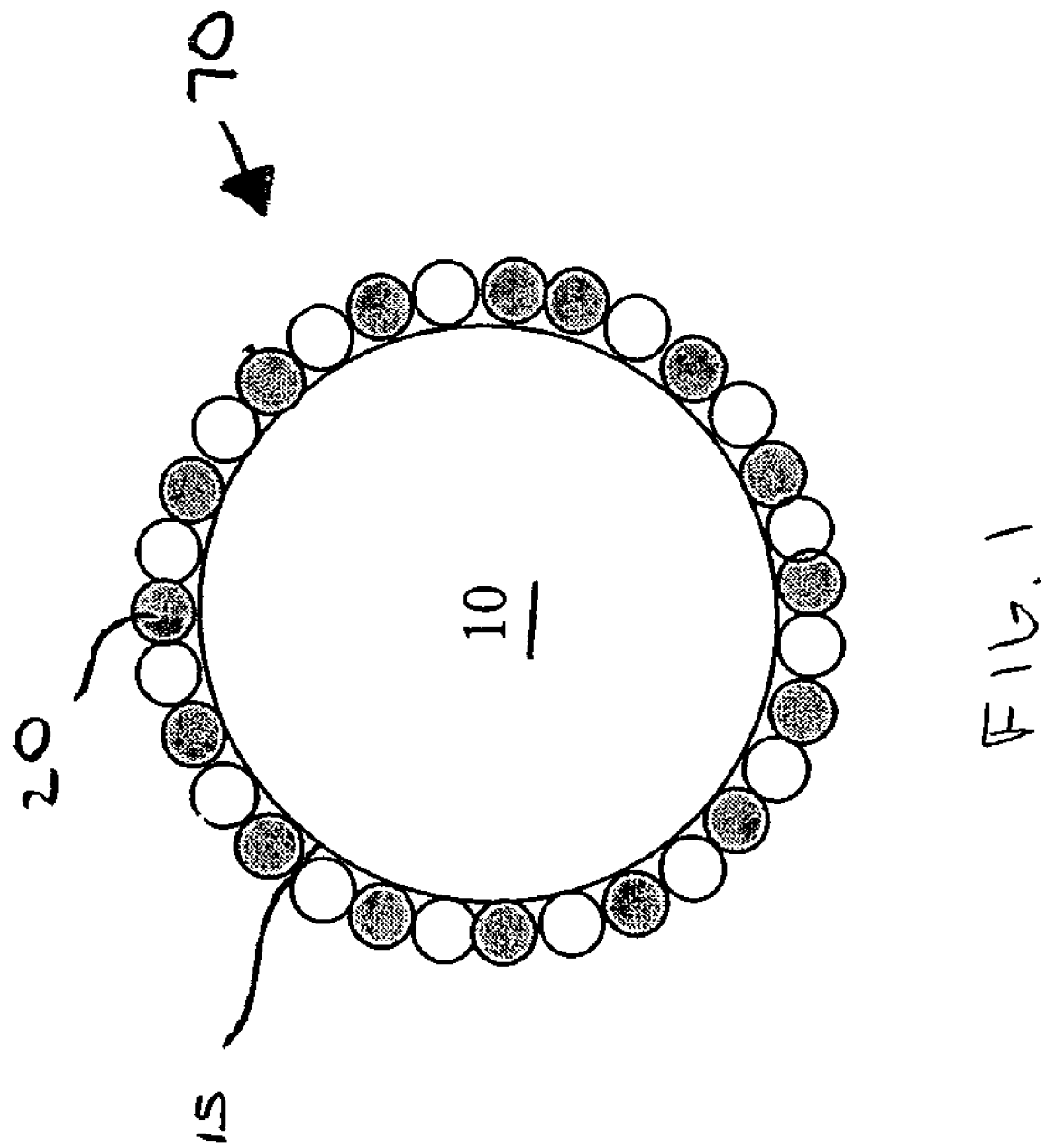
FIG. 1 is a schematic illustration of a nanocrystal complex according to an embodiment of the present invention.

Referring to FIG. 1, in an embodiment, the present invention provides a nanocrystal complex 70 comprising a semiconductor nanocrystal core 10 (also known as a semiconductor nanoparticle or semiconductor quantum dot) having an outer surface 15. Semiconductor nanocrystal core 10 may be spherical nanoscale crystalline materials (although oblate and oblique spheroids can be grown as well as rods and other shapes) having a diameter of less than the Bohr radius for a given material and typically but not exclusively comprises II-IV, III-V, or IV-VI binary semiconductors. Non-limiting examples of semiconductor materials that semiconductor nanocrystal core 10 can comprise include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials). In a preferred embodiment, semiconductor nanocrystal core 10 comprises III-V semiconductor nanocrystal materials. In addition to binary semiconductors, semiconductor nanocrystal core 10 may comprise ternary semiconductor materials. Non-limiting examples of ternary semiconductor materials include AxByC wherein A may comprise a group II, III or IV element, B may comprise a group II, III, or IV element, and C may comprise a group V or VI element, and x and y are molar fractions between 0 and 1.

One or more metals 20 are formed on outer surface 15 of semiconductor nanocrystal core 10 (referred to herein as "metal layer" 20). Metal layer 20 may act to passivate outer surface 15 of semiconductor nanocrystal core 10 and limit the diffusion rate of oxygen molecules to semiconductor nanocrystal core 10. According to the present invention, metal layer 20 is formed on outer surface 15 after synthesis of semiconductor nanocrystal core 10 (as opposed to being formed on outer surface 15 concurrently during synthesis of semiconductor nanocrystal core 10). Metal layer 20 may include any number, type, combination, and arrangement of metals. For example, metal layer 20 may be simply a monolayer of metals formed on outer surface 15 or multiple layers of metals formed on outer surface 15. Metal layer 20 may also include different types of metals arranged, for example, in alternating fashion. Further, metal layer 20 may encapsulate semiconductor nanocrystal core 10 as shown in FIG. 1 or may be formed on only parts of outer surface 15 of semiconductor nanocrystal core 10. Metal layer 20 may include the metal from which the semiconductor nanocrystal core is made either alone or in addition to another metal. Non-limiting examples of metals that may be used as part of metal layer 20 include Cd, Zn, Hg, Pb, Al, Ga, or In.

Semiconductor nanocrystal complex 70, according to the present invention, is electronically and chemically stable with a high luminescent quantum yield. Chemical stability refers to the ability of a semiconductor nanocrystal complex to resist fluorescence quenching over time in aqueous and ambient conditions. Preferably, the semiconductor nanocrystal complexes resist fluorescence quenching for at least a week, more preferably for at least a month, even more preferably for at least six months, and most preferably for at least a year. Electronic stability refers to whether the addition of electron or hole withdrawing ligands substantially quenches the fluorescence of the semiconductor nanocrystal complex. Preferably, a semiconductor nanocrystal complex would also be colloidally stable in that when suspended in organic or aqueous media (depending on the ligands) they remain soluble over time. A high luminescent quantum yield refers to a quantum yield of at least 25%. Quantum yield may be measured by comparison to Rhodamine 6G dye with a 488 excitation source. Preferably, the quantum yield of the semiconductor nanocrystal complex is at least 30%, more preferably at least 45%, and even more preferably at least 55%, as measured under ambient conditions. The semiconductor nanocrystal complexes of the present invention experience little loss of fluorescence over time and can be manipulated to be soluble in organic and inorganic solvents as traditional semiconductor nanocrystals.

Semiconductor nanocrystal core 10 and metal layer 20 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Figure 2:
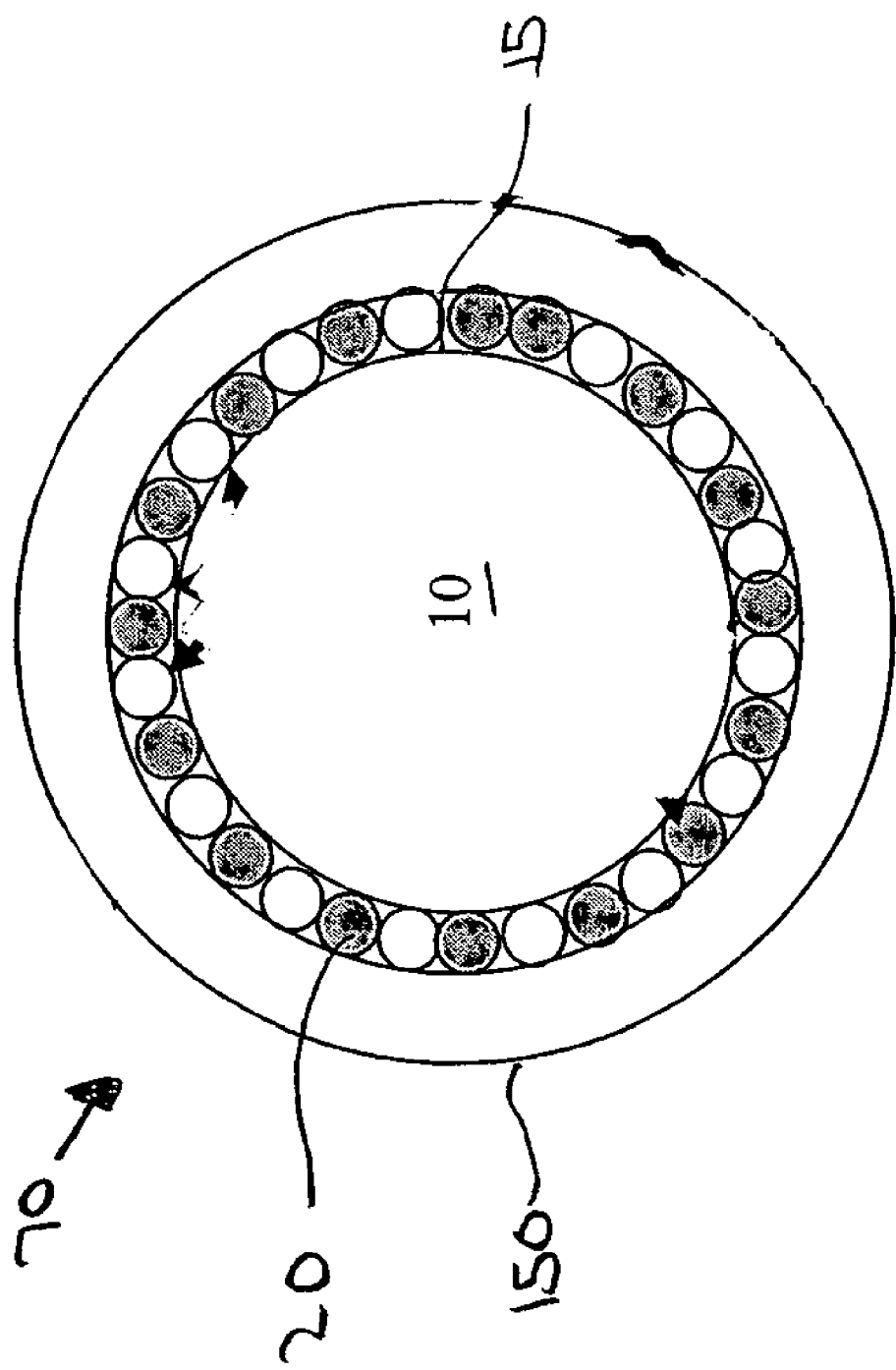
FIG. 2 is a schematic illustration of a nanocrystal complex according to another embodiment of the present invention.

Referring to FIG. 2, in an alternative embodiment, the present invention provides a nanocrystal complex 70 further comprising a shell 150 overcoating metal layer 20. Shell 150 may comprise a semiconductor material having a bulk bandgap greater than that of semiconductor nanocrystal core 10. In such an embodiment, metal layer 20 may act to passivate outer surface 15 of semiconductor nanocrystal core 10 as well as to prevent or decrease lattice mismatch between semiconductor nanocrystal core 10 and shell 150.

Shell 150 may be grown around metal layer 20 and is typically between 0.1 nm and 10 nm thick. Shell 150 may provide for a type A semiconductor nanocrystal complex 70. Shell 150 may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, or PbTe.

One example of shell 150 that may be used to passivate outer surface 15 of semiconductor nanocrystal core 10 is ZnS. The presence of metal layer 20 may provide for a more complete and uniform shell 150 without the amount of defects that would be present with a greater lattice mismatch. Such a result may improve the quantum yield of resulting nanocrystal complex 70.

Semiconductor nanocrystal core 10, metal layer 20, and shell 150 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

The present invention also provides a substantially monodisperse population of semiconductor nanocrystal complexes, each semiconductor nanocrystal complex comprising a semiconductor nanocrystal core comprising a III-V semiconductor material, wherein the substantially monodisperse population of semiconductor nanocrystal complexes is stable with a high luminescent quantum yield.

Figure 3:
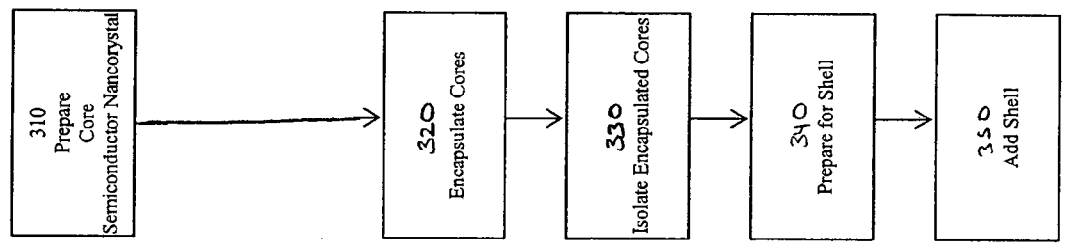
FIG. 3 is a flow chart illustrating a method of making a nanocrystal complex according to the present invention.

FIG. 3 provides an exemplary method of making a nanocrystal complex of the present invention. Although the exemplary method will be described with respect to the preparation of a InGaP semiconductor nanocrystal core, a metal layer of Zn and a ZnS shell, it will be appreciated that other types and combinations of semiconductor cores, metal layers, and semiconductor shells may be used.

In step 310, a semiconductor nanocrystal core is prepared. There are numerous ways to prepare semiconductor nanocrystal cores some of which have been described above. The specific procedure for growing a core semiconductor nanocrystal comprising a III-V semiconductor material is described below. Although, the procedure is described with respect to the preparation of an InGaP core, a ternary semiconductor, a binary semiconductor material may be grown using the teachings of the procedure. One method of preparing a semiconductor nanocrystal core involves InGaP in TOPO. In order to isolate the semiconductor nanocrystals cores from a TOPO solution, methanol and toluene can be added to the solution, as semiconductor nanocrystal cores prepared in TOPO are insoluble in methanol and soluble in toluene. Enough methanol should be added to precipitate out the semiconductor nanocrystal cores and enough toluene should be added to ensure not to precipitate any of the radical complexes created during the preparation of the semiconductor nanocrystal cores. The result of washing the semiconductor nanocrystal cores in methanol and toluene results in semiconductor nanocrystals cores precipitating out of solution.

In step 320, the metal layer is added to the semiconductor nanocrystal core to encapsulate the semiconductor nanocrystal core (or to otherwise form a metal layer on the outer surface of the semiconductor nanocrystal core). Zinc oleate in TOP dissolved in methanol, for example, can be used as precursors to create the metal layer, although many other precursors may be used. For example, diethylzinc, zinc acetate, zinc oxalate, zinc stearate, and zinc oxide can be used as precursors for the preparation of a metal layer of Zn. It is also appreciated that many other precursors exist and may be used for the preparation of a metal layer comprising metals other than Zn.

Once the solution of a metal precursor(s) is prepared, it is added to the semiconductor nanocrystal core solution resulting in a solution of semiconductor nanocrystal cores, purified solvent, and metal precursor. This resulting solution can then be heated and remain heated until the metal layer is formed on the semiconductor nanocrystal core. In the procedure described below, a microwave synthesis machine is used for the reaction. It should be appreciated that in the event that traditional heating methods are used for the reaction, the amount of time necessary to form the metal layer as well as the temperature at which the reaction best occurs may vary. The resulting mixture includes semiconductor nanocrystal cores with a metal layer and the ligands used to prepare the reaction.

In step 330, the semiconductor nanocrystal cores with the metal layer are isolated. First, they can be drawn out of solution using the technique described in step 310. Specifically, methanol and toluene can be added to the solution in amounts that make the nanocrystal complex, in this case the semiconductor nanocrystal core and the metal layer, insoluble. The complexes will precipitate out of the solution resulting in a semiconductor nanocrystal complex comprising a semiconductor nanocrystal core having an outer surface and a metal layer attached to the outer surface.

Alternatively, once the complexes comprising the semiconductor nanocrystal core and the metal layer are drawn out of the solution, a shell can be added using known shelling techniques. Such an alternative embodiment involves step 340—preparing the semiconductor nanocrystal core with metal layer formed thereon for shelling. In one exemplary embodiment, ZnS is grown on the core semiconductor nanocrystal with a metal layer. Initially, the isolated nanocrystal core of the III-V semiconductor nanocrystal material and the metal layer can be dissolved in toluene and the resulting solution can be introduced into a solution containing a ligand. The ligand can be, for example, technical grade TOPO or TOP that has been purified using the technique described in step 320. The toluene can then be removed leaving a solution of the III-V core nanocrystals with a metal layer of Zn.

In step 350, the shell is added to the semiconductor nanocrystal core having a metal layer thereon. To form the shell, two precursor solutions can be added to the solution of the semiconductor nanocrystal core with metal layer thereon. The first solution can be a metal precursor in a ligand, the second solution can be (TMS)$_2$S in TOP. Enough of the solutions is added to allow ZnS to shell the surface of the semiconductor nanocrystal core with metal layer thereon.

An alternative to shelling the semiconductor nanocrystal that can result in an outer coating of a desired semiconductor material is through the addition of a chalcagonide, pnictide or a non-metal anion layer and the addition of a second metal layer. Treating a semiconductor nanocrystal complex with an anion and then adding a second metal layer stabilizes the luminescent properties of the resulting complex. Additionally, treating the complex with an anion and an additional metal layer creates a resulting complex that can be stably added to a variety of solvents including water and other organic and inorganic solvents with little or no loss of fluorescence using standard nanocrystal chemistries. The procedure for adding the non-metal anion layer and the second metal layer is described below in detail.

One or more anions may be attached to the semiconductor nanocrystal core containing the newly added metal layer. Anion layer may include any number, type, combination, and arrangement of anions. For example, anion layer may be simply a monolayer of anions added to the metal layer. Non-limiting examples of elements that may comprise the anion layer include group IV, V, and VI elements. As described below, after the formation of the anion layer, a metal layer may be added to the surface of the anion layer.

Once the nanocrystal synthesis is complete, the desired nanocrystal complexes precipitate out of solution. All the above described steps may take place under nitrogen to improve the quantum yield of the resulting nanocrystal complex. The resulting nanocrystal complexes are more resistant to oxidation and have an increased quantum yield over semiconductor nanocrystals of III-V made by known techniques. The nanocrystals resulting from step 350 may be size separated. Size separating the nanocrystal yields solutions with crystals that are monodisperse and retain the quantum yield.

The above-described technique is only exemplary and other modifications may be made that result in semiconductor nanocrystal complexes according to the present invention.

EXAMPLE

Preparing a III-V Semiconductor Nanocrystal Complex

The present example discloses how to prepare a stable, high luminescent quantum yield semiconductor nanocrystal complex comprising an InGaP semiconductor nanocrystal core and a Zn metal layer formed on the outer surface of the semiconductor nanocrystal core after synthesis of the semiconductor nanocrystal core.

First, an indium precursor is prepared. In a reaction flask, 292 g/mol of 0.9 Molar indium (III) acetate (99.99% pure), is added to 367 g/mol of 0.1 Molar gallium acetylacetonoate (99% pure) and 256.4 g/mol of 3 Molar almitic acid (99% pure). The ingredients are mixed and heated to 130° C. for 2 hours under vacuum. The vacuum removes the acetic acid that could form. The resulting solution should be clear but may have a yellow tint.

Next, a phosphorous precursor and a zinc oleate precursor is prepared. The phosphorous precursor is formed by adding 0.3 mL TMSphosphine and 4.0 mL TOP under nitrogen. The zinc oleate precursor is formed by heating at 140° C., 1.83 g of 10 mmol zinc acetate, 6.49 mL of oleic acid, and 3.5 mL of octadecene in a reaction flask for 2.5 hours. The resulting solution should be clear to yellow.

After the preparation of the precursors, the InGaP semiconductor nanocrystal core is prepared. In a closed reaction flask, 700 mg of the indium precursor, prepared above is added to 1 g of octadecyl amine or hexadecylamine, 1 g of 99% pure TOPO, and 1 mL of toluene or octadecene. The system is purged with nitrogen and the reaction is heated to 220° C. in a Discovery microwave system (CEM Corporation, Matthews, N.C.) and 2.5 mL of the phosphorous precursor, prepared above, is injected into the reaction flask and the reaction is heated to 290° C. for 7 minutes. Finally, the reaction is allowed to cool to 50° C. The resulting semiconductor complex is a InGaP core semiconductor nanocrystal. The amount of indium precursor added to the mixture controls the size of the core nanocrystals. 700 mg of indium precursor results in a core semiconductor nanocrystal that upon excitation will emit light at 660 nm. As the amount of indium precursor added in the preparation of the core is increased, the emission wavelength will likewise increase.

To the flask containing the InGaP semiconductor nanocrystal complex, the 0.8 g of zinc oleate precursor is added. The system is purged with nitrogen and heated to 280° C. for 7 minutes and the reaction is allowed to cool to 50° C.

After the addition of the metals to the outer surface of the semiconductor nanocrystal core, the resulting semiconductor nanocrystal complex is washed. To wash the semiconductor nanocrystal complex, toluene and methanol are added to the reaction flask, and the flask is heated in a hot bath at, approximately, 69° C. for 15 minutes. The supernatants are then removed from the reaction flask by centrifuging the reaction flask at 2000 rpm for 1 minute and decanting the supernatant. Once the supernatant is removed the nanocrystal complexes should be re-solvated in an organic solvent, such as toluene.

Once solvated, the nanocrystal complexes are treated with an anion and a second metal layer. To add this outer coating onto the nanocrystal complex, 70 mg of elemental sulfur (1 mM) is dissolved in 4.0 mL TOP by heating in hot bath and sonication. 1.0 mL of the sulfur is added to 1.0 mL of the nanocrystal complex/solvent solution. Then 0.5 mg of TOPO, (99% pure) is added to the flask and the system is purged with nitrogen. The mixture is heated to 280° C. in a CEM Discovery microwave system for 1 minute.

The fluorescence of the nanocrystal complex should be temporarily quenched due to the presence of sulphur on the surface. The complex is next washed following the procedure described above for washing except the heating step is not performed.

A second metal layer is next added to the semiconductor nanocrystal complex. To add a second metal layer onto the nanocrystal complex, 0.5 mg of TOPO (99% pure) is added to the flask containing the nanocrystal complex/toluene solution resulting from the washing step. 0.8 g zinc oleate is then added to the flask. Finally, the system is purged with nitrogen and heated to 280° C. in a CEM Discovery microwave system for 2 minutes. In order to isolate the semiconductor nanocrystals, the washing step is performed for a third time, this time without the heating step.

The resulting semiconductor nanocrystal complexes are size separated. This is done by diluting the resulting nanocrystals with toluene and adding MeOH (~100 uL) into the mixture until it becomes slightly cloudy. The solution is poured into a syringe and filtered through a 0.45 um PTFE syringe. The retentate is solvated from the syringe filter by using 2.0 mL of toluene.

The separation step with MeOH is repeated until the product mixture becomes dilute (no visible color).

The foregoing description and example have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

We claim:

1. A semiconductor nanocrystal complex comprising:
   a semiconductor nanocrystal core comprising a III-V semiconductor material, and
   a metal layer formed on at least a portion of an outer surface of the semiconductor nanocrystal core,
   wherein the semiconductor nanocrystal complex is electronically and chemically stable with a luminescent quantum yield of at least 25%.

2. The semiconductor nanocrystal complex of claim 1, wherein the semiconductor nanocrystal complex further comprises: the metal layer formed on the outer surface of the semiconductor nanocrystal core; and a shell comprising a semiconductor material overcoating the metal layer.

3. The semiconductor nanocrystal complex of claim 1, wherein the semiconductor nanocrystal complex further comprises: the metal layer formed on the outer surface of the semiconductor nanocrystal core; and an outer coating comprising an anion layer overcoating the metal layer and a second metal layer overcoating the anion layer.

4. The semiconductor nanocrystal complex of claim 1, wherein the semiconductor nanocrystal core comprises InP.

5. The semiconductor nanocrystal complex of claim 1, wherein the semiconductor nanocrystal core is a ternary semiconductor nanocrystal.

6. The semiconductor nanocrystal complex of claim 5, wherein the ternary semiconductor nanocrystal is InGaP.

7. The semiconductor nanocrystal complex of claim 2, wherein the shell comprises ZnS.

8. The semiconductor nanocrystal complex of claim 1, wherein the metal layer comprises Zn.

9. The semiconductor nanocrystal complex of claim 1, wherein the luminescent quantum yield is at least 35%.

10. The semiconductor nanocrystal complex of claim 1, wherein the luminescent quantum yield is at least 45%.

11. The semiconductor nanocrystal complex of claim 1, wherein the luminescent quantum yield is at least 55%.

12. The semiconductor nanocrystal complex of claim 2, wherein the semiconductor nanocrystal complex comprises InP, and wherein the shell comprises ZnS and the metal layer comprises Zn.

13. A substantially monodisperse population of semiconductor nanocrystal complexes, each semiconductor nanocrystal complex comprising:
   a semiconductor nanocrystal core, the semiconductor nanocrystal core comprising a III-V semiconductor material, and
   metal layer formed on at least a portion of an outer surface of the semiconductor nanocrystal core,
   wherein the substantially monodisperse population of semiconductor nanocrystal complexes is electronically and chemically stable with a luminescent quantum yield of at least 25%.

14. A method of making a semiconductor nanocrystal complex with an outer surface comprising:
   synthesizing a semiconductor nanocrystal core comprising a III-V semiconductor nanocrystal material having an outer surface; and
   forming a metal layer on at least a portion of the outer surface of the semiconductor nanocrystal core after synthesis of the semiconductor nanocrystal core.

15. The method of claim 14, further comprising overcoating the metal layer with an anion layer.

16. The method of claim 15, further comprising overcoating the anion layer with a second metal layer.

17. The method of claim 14, further comprising overcoating the metal layer with a shell comprising a semiconductor material.

18. The semiconductor nanocrystal complex of claim 1, wherein the metal layer is formed directly onto the at least a portion of the outer surface of the core.

19. The semiconductor nanocrystal complex of claim 1, wherein the luminescent quantum yield is at least 30%.

* * * * *